(12) United States Patent
Lin

(10) Patent No.: US 6,718,495 B2
(45) Date of Patent: Apr. 6, 2004

(54) CGROM TESTING DEVICE

(75) Inventor: Shih-Che Lin, Feng Yuan (TW)

(73) Assignee: Wintek Corporation, Taichung (TW)

(*) Notice: Subject to any disclaimer, the term of this patent is extended or adjusted under 35 U.S.C. 154(b) by 365 days.

(21) Appl. No.: 09/975,942

(22) Filed: Oct. 15, 2001

(65) Prior Publication Data

US 2003/0074622 A1 Apr. 17, 2003

(51) Int. Cl.⁷ .............................................. G01R 31/28
(52) U.S. Cl. ................................................... 714/724
(58) Field of Search ............................. 714/724, 718, 714/742, 738, 733, 734, 736, 57

(56) References Cited

U.S. PATENT DOCUMENTS 4,450,405 A * 5/1984 Howard ..................... 324/234
5,541,505 A * 7/1996 Azumai ..................... 324/158.1
5,775,809 A * 7/1998 Cooley et al. .............. 374/164

* cited by examiner

Primary Examiner—Christine T. Tu
(74) Attorney, Agent, or Firm—Rosenberg, Klein & Lee (57) ABSTRACT

A CGROM testing device including a main body, a probe module and a circuit module. In the main body are disposed an EPROM having inbuilt character pattern data of a number of predetermined characters, a first IC having functions of data comparison and data memorization and a second IC having functions of signal output and control. The probe module receives the output signals of the CGROM of a controlling IC of a PCB. An analog multiplex selection circuit of the circuit module selects data and an analog-to-digital converting circuit converts the signals into digital signals. The first IC compares the character pattern data of predetermined characters inbuilt in the EPROM with the character code driven by the CGROM and the second IC outputs the comparison result.

4 Claims, 9 Drawing Sheets

CGROM TESTING DEVICE

BACKGROUND OF THE INVENTION

The present invention is related to a character generator read only memory (CGROM) testing device. The character pattern data of predetermined characters are previously recorded in the EPROM. A first IC compares the data of the EPROM with the character code output by the CGROM so as to judge whether the CGROM of the controlling IC of PCB is defective or not.

A conventional liquid crystal display module (LCM) sometimes fails to fully display characters. This is generally because that the character generator read only memory (CGROM) of the controlling IC in the LCM is defective. The defective CGROM often results from that the IC manufacturer fails to entirely test the CGROM. The existent test is mainly visual test. In general, there are about 180~240 inbuilt characters of the CGROM and the LCM can display multiple different characters to form a picture. With 5×7 character exemplified, each character is divided into 35 small square blocks. In case each character should be completely checked, all the small blocks must be visually checked. Generally one picture will have several to several decades of different characters. Accordingly, it will cost several to several decades of seconds to completely check a picture. When many pictures need to be checked, it often takes several minutes to complete the check. Therefore, the efficiency of check is very low. In addition, the visual check often results in error and incomplete check.

SUMMARY OF THE INVENTION

It is therefore a primary object of the present invention to provide a CGROM testing device. After each character to be tested is converted into seven 8-bit hexadecimal data, the data are previously recorded in the EPROM. The display panel is driven by controlling IC of PCB to display characters of CGROM to be tested. Probes are used to contact with the COM and SEG test points on the PCB to obtain analog signals. By means of the sequential selection of the analog multiplex selection circuit and the conversion of the analog-to-digital converting circuit, the first IC compares the character pattern data of predetermined characters inbuilt in the EPROM with the digital data so as to judge whether the character of the CGROM is problematic or not. A tester can easily judge whether the CGROM of the PCB is problematic from the green light, red light and buzzer and the display panel. Accordingly, it only takes several seconds to complete the test of one PCB. The labor is saved and the test can be quickly completed. Moreover, the man-made error can be minimized.

The present invention can be best understood through the following description and accompanying drawings wherein:

DETAILED DESCRIPTION OF THE PREFERRED EMBODIMENTS

Please refer to FIGS. 1 to 9. The present invention includes a main body 10, a probe module 20 and a circuit module 30.

In the main body 10 are disposed an erasable programmable read only memory (EPROM) 11 (which in this embodiment is IC of 27C512), a first IC 12 (which in this embodiment is IC of 8051 and a second IC 13 (which in this embodiment is IC of 8255). The EPROM 11 has inbuilt character pattern data of a number of predetermined characters. The data of the EPROM 11 can be output to the first IC 12. The first IC 12 has functions of data comparison and data memorization and is controlled by a switch 14 to be turned on or off. The first IC 12 is linked with the second IC 13 which has functions of signal output and control.

Figure 1:
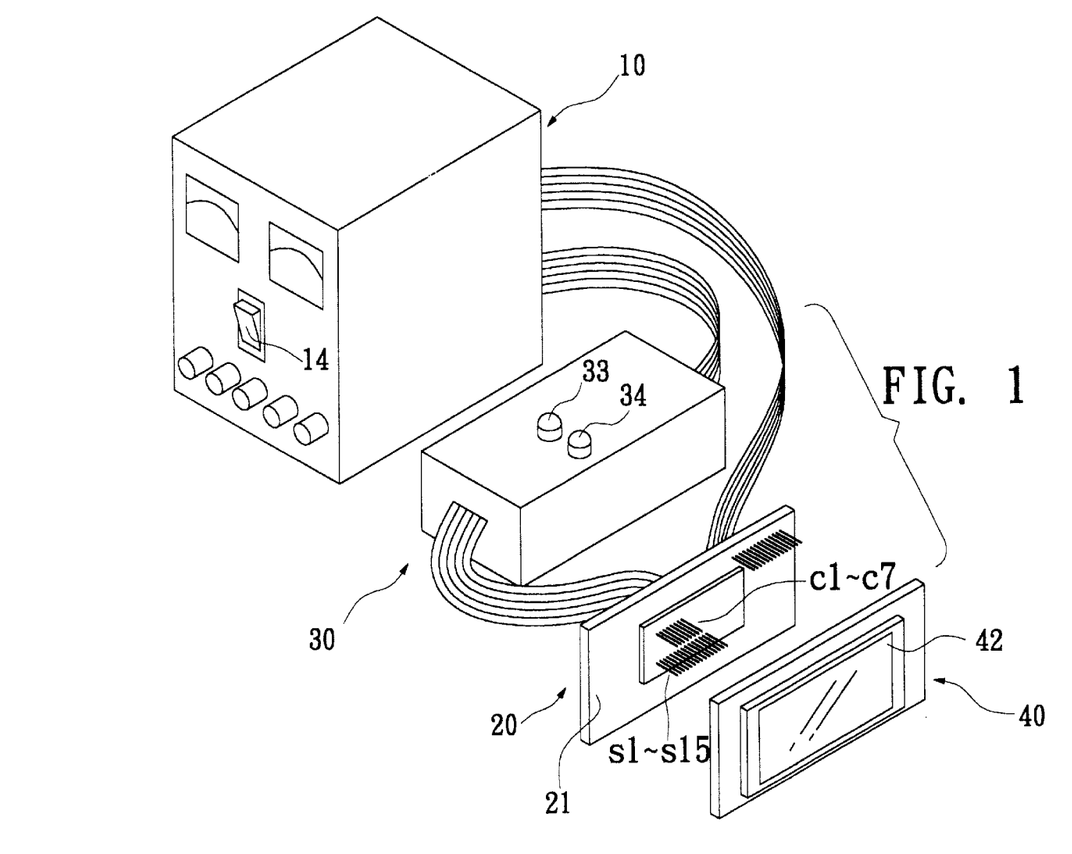
FIG. 1 is a view showing the arrangement of the CGROM testing device of the present invention.
Figure 2:
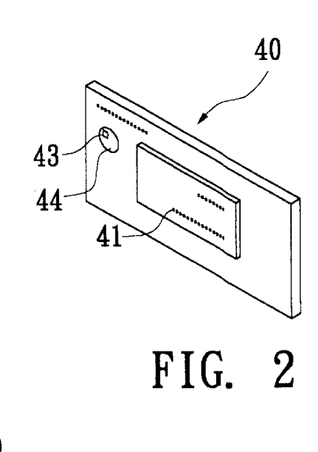
FIG. 2 is a back view of the PCB of the CGROM testing device of the present invention, showing the CGROM of the controlling IC.

The probe module 20 is connected with the second IC 13 and controlled thereby. The probe module 20 has a locating board 21 on which a PCB 40 is connected. Fifteen SEG signal probes s1~s15 and seven COM signal probes c1~c7 extend from one side of the locating board 21. The fifteen SEG signal probes s1~s15 and seven COM signal probes c1~c7 are respectively inserted in 22 hole-like detection points 41 of the PCB 40. The PCB 40 is further connected with a display panel 42 to form an LCM. The PCB 40 has a controlling IC 44 having a CGROM 43 for driving the display panel 42. In addition, the PCB 40 is controllable by the second IC 13 to display predetermined characters on the display panel 42.

The circuit module 30 has an analog multiplex selection circuit 31 and an analog-to-digital converting circuit 32. The analog multiplex selection circuit 31 receives the signals of the fifteen SEG signal probes s1~s15 of the probe module 20 and the signals of the first IC 12 and second IC 13. The fifteen SEG signal probes s1~s15 are divided into a first group SA of probes s1~s5, a second group SB of probes s6~s10 and a third group SC of probes s11~s15. The three groups of probes are respectively connected to the analog multiplex selection circuit 31. The signals of the first IC 12 and second IC 13 control and select of which group of probes the signals can be input to the analog-to-digital converting circuit 32. The analog-to-digital converting circuit 32 further receives the signals of the seven COM signal probes c1~c7 of the probe module 20. The analog-to-digital converting circuit 32 converts the received signals into digital signals and transmits the signals to the first IC 12 for data comparison. In addition, the circuit module 30 is provided with a green light 33, a red light 34 and a buzzer 35 respectively driven by the second IC 13. The green light 33 and red light 34 are made of light emitting diodes (LED).

Referring to FIGS. 3 to 5D, after the character to be tested is converted into seven 8-bit hexadecimal data, the data are previously recorded in the EPROM 11. The PCB 40 is connected with the probe module 20. Then, the switch 14 is switched on to make the first IC 12 drive the second IC 13 and make the second IC 13 drive the display panel 42 of the PCB 40 so as to display the character to be tested. The fifteen SEG signal probes s1~s15 and seven COM signal probes c1~c7 are respectively used to test the test points 41 of the PCB 40 so as to obtain seven COM signals and fifteen SEG signals divided into three groups each having five signals.

Figure 3:
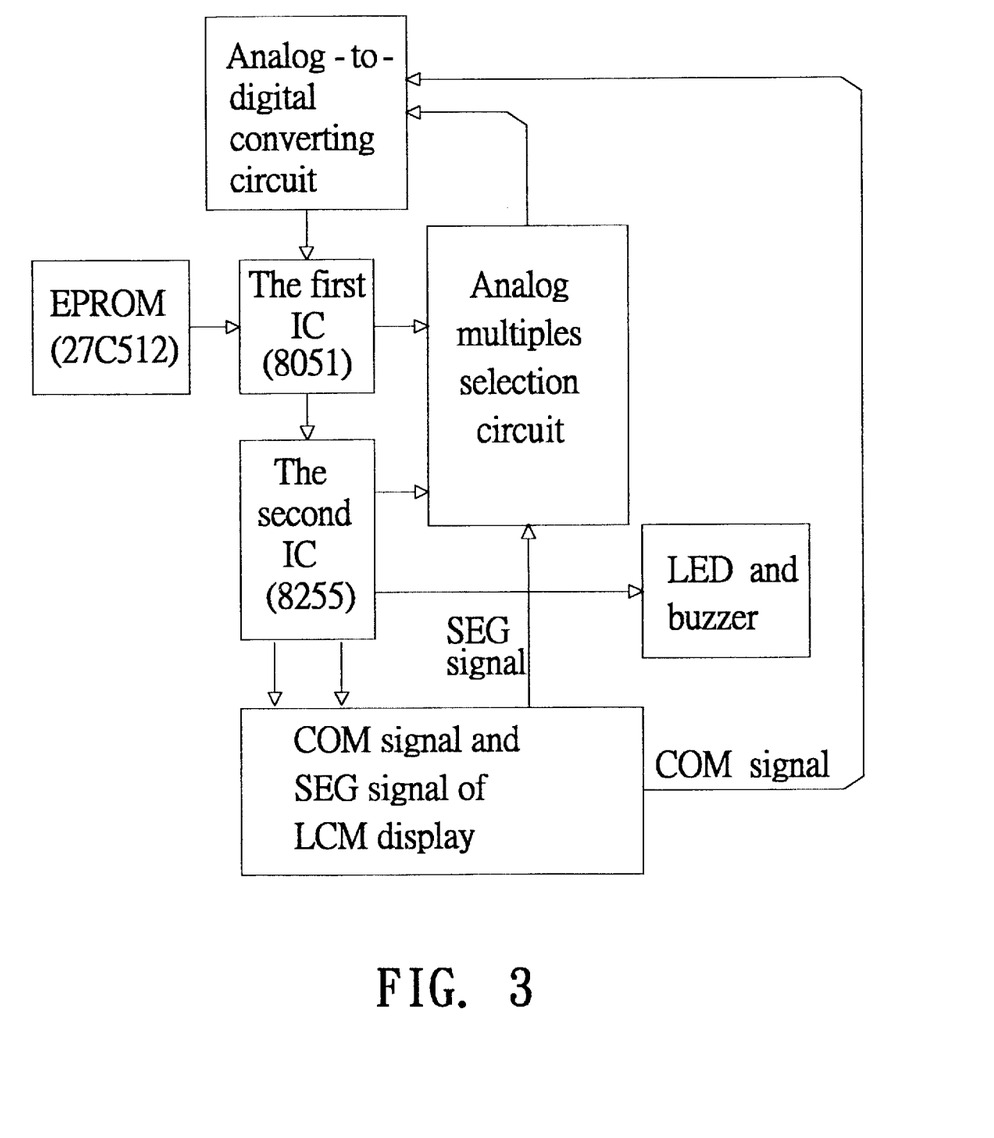
FIG. 3 is flow chart of the test of the present invention.
Figure 4:
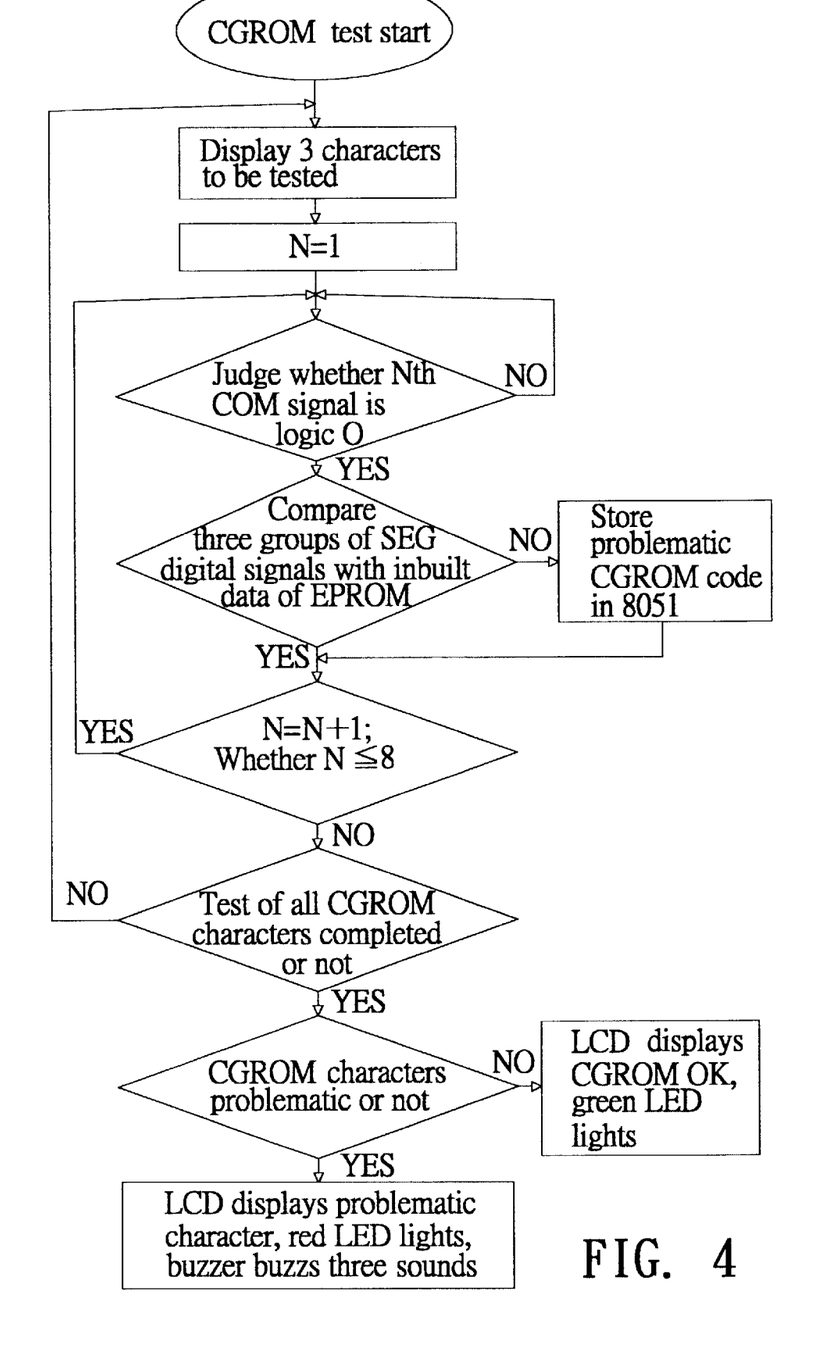
FIG. 4 is a flow chart of the logic operation of the present invention.
Figure 5A:
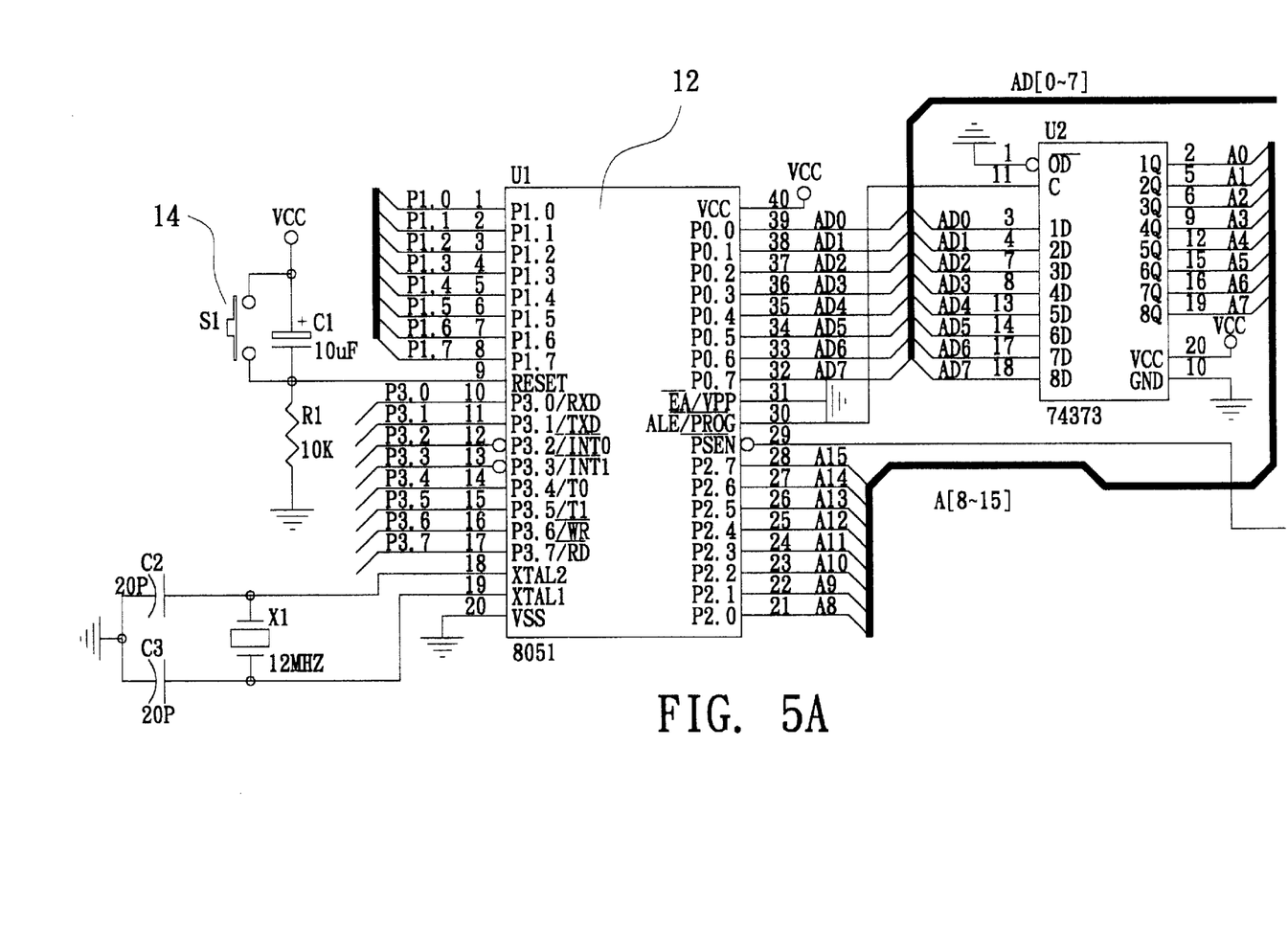
FIG. 5A is a first circuit diagram of the present invention, showing the first IC.
Figure 5B:
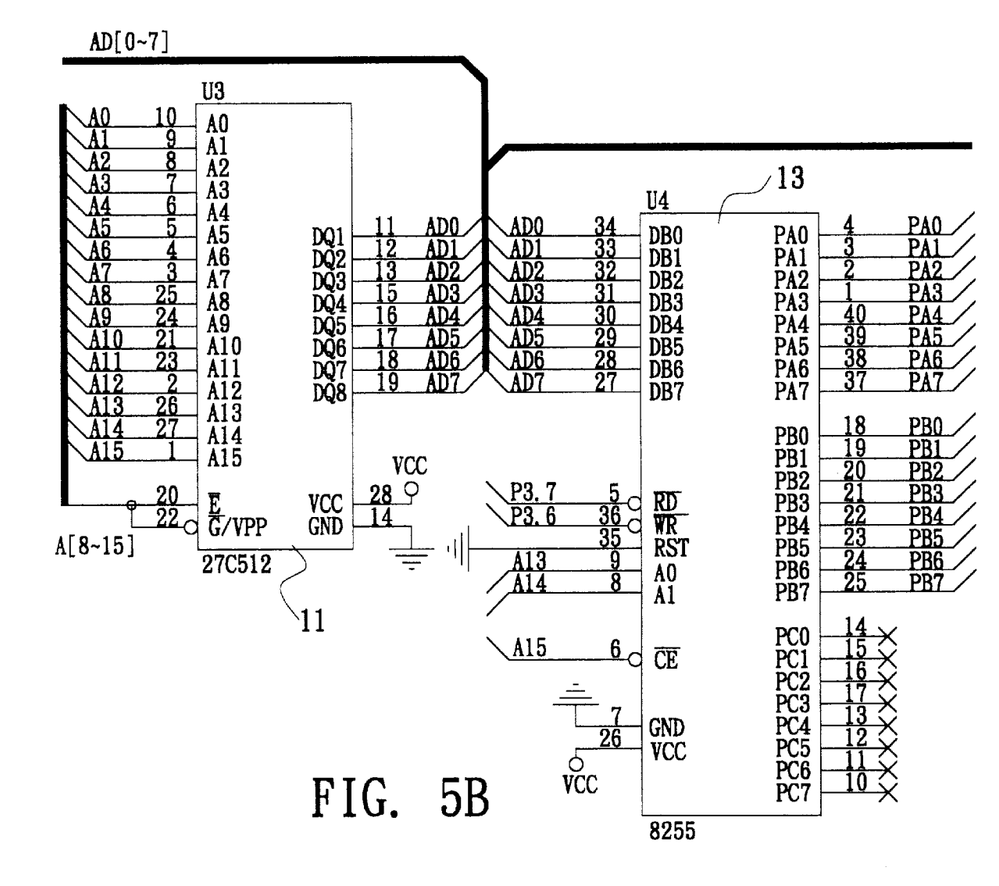
FIG. 5B is a second circuit diagram of the present invention, showing the second IC and EPROM.
Figure 5C:
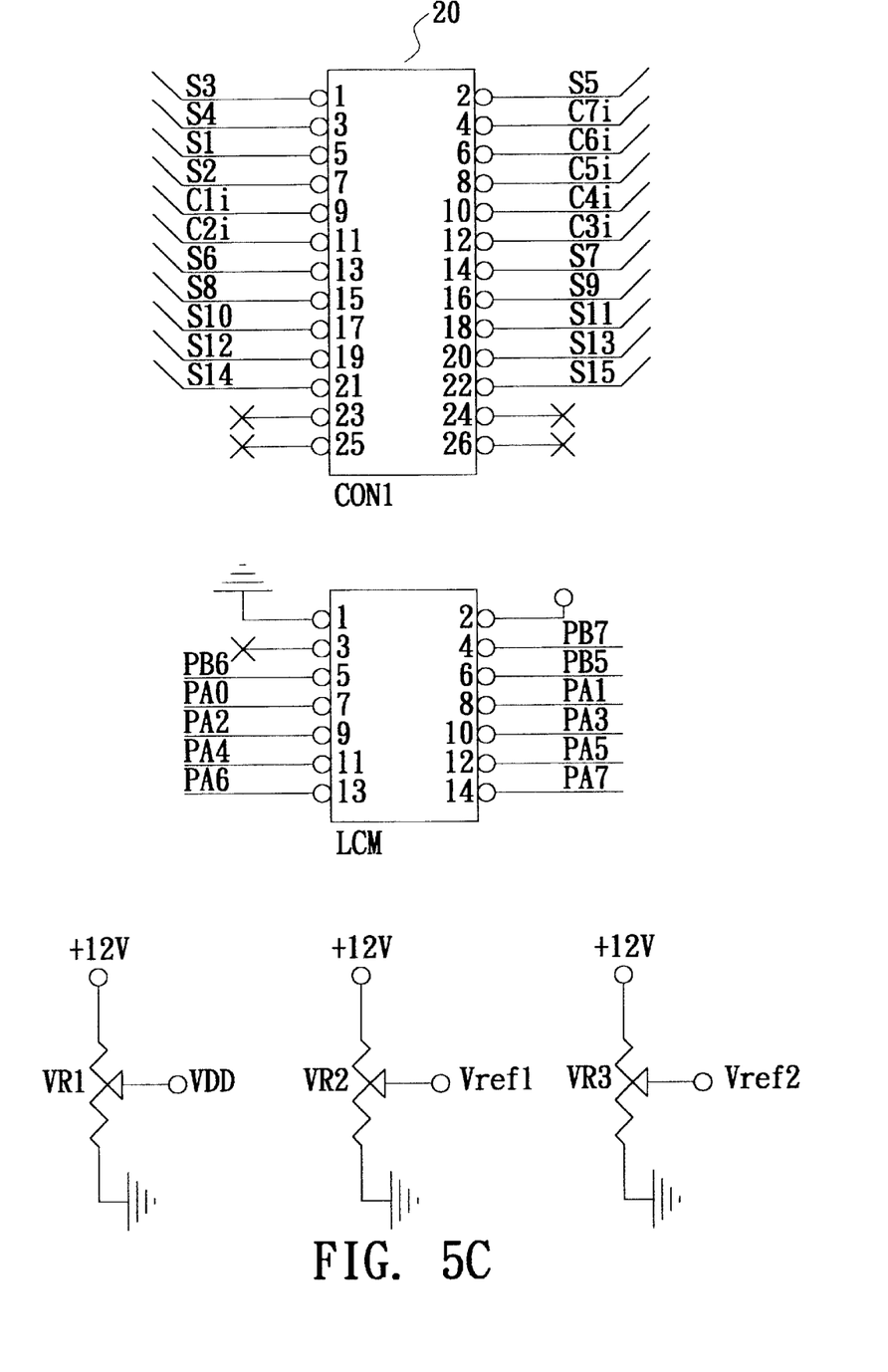
FIG. 5C is a third circuit diagram of the present invention, showing the probe module.
Figure 5D:
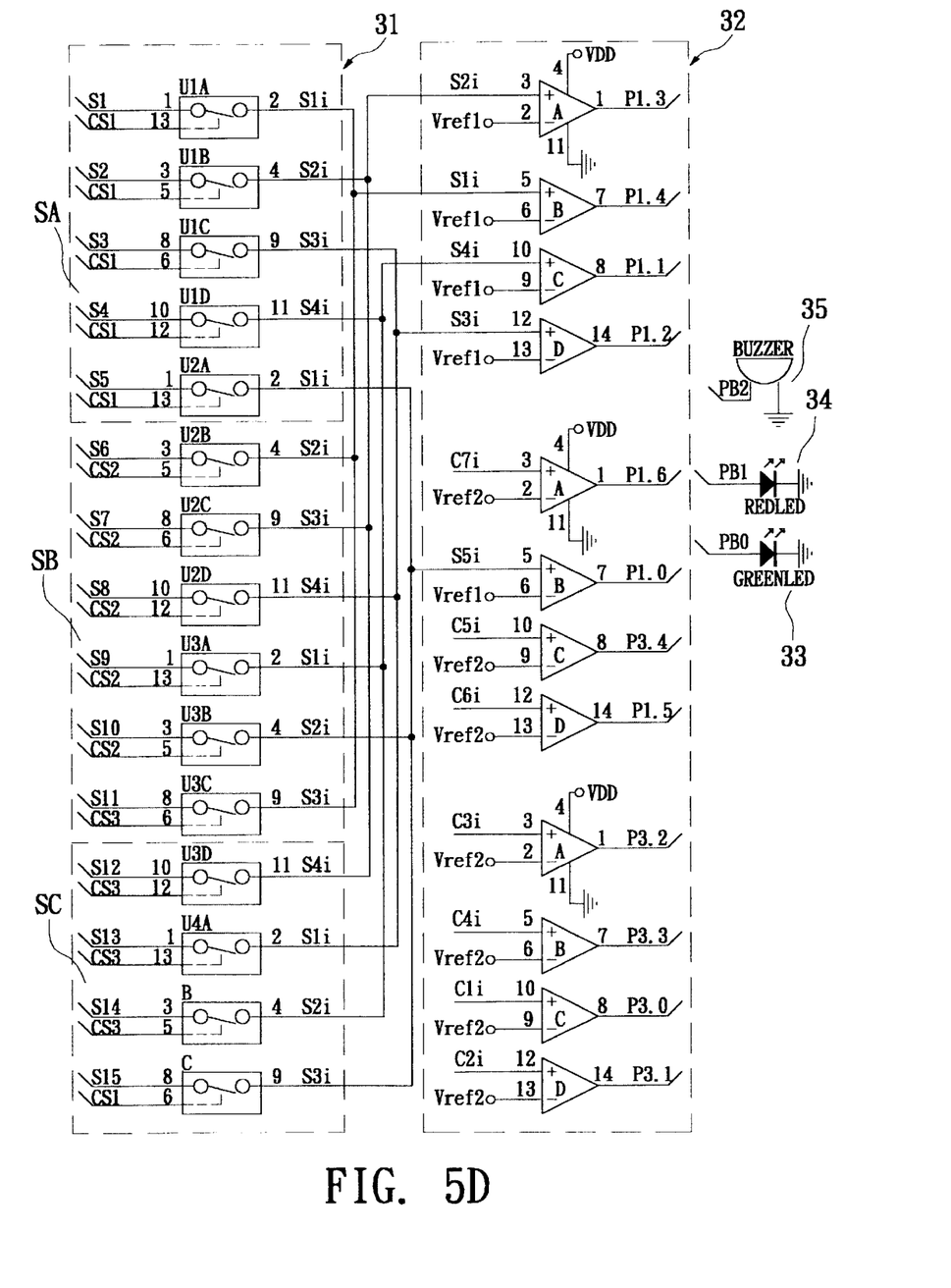
FIG. 5D is a fourth circuit diagram of the present invention, showing the circuit module.
Figure 6:
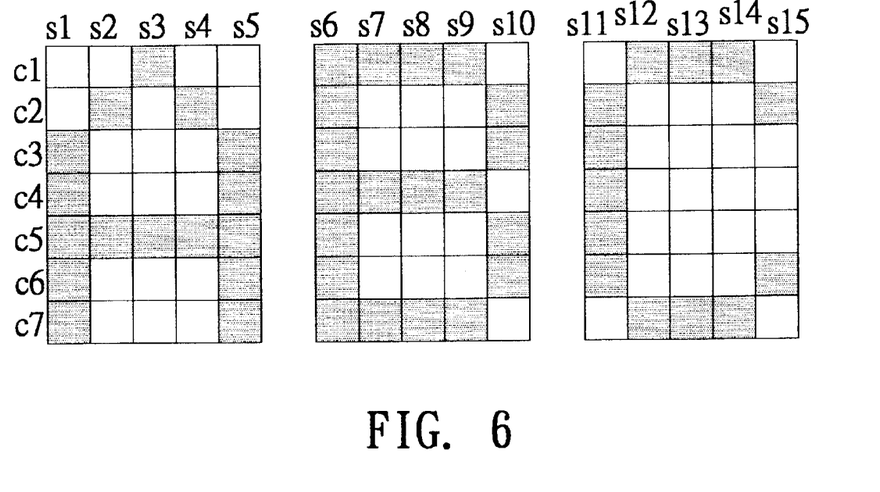
FIG. 6 shows characters A, B, C of the present invention.

According to the display manner of the LCM display module, row c1 is first displayed and then row c2 . . . to c7 (as shown in FIGS. 3, 4 and 6). Accordingly, 60 times of display are circularly repeated each second. (In this embodiment, 60 Hz is exemplified.) Prior to display of each row, a logic 0 signal is first output. The signals through the seven COM signal probes c1~c7 are transmitted to the analog-to-digital converting circuit 32 and sent to the first IC 12. When the first IC 12 receives the first COM signal which is logic 0, the first IC 12 will count the number of times and at the same time control the analog multiplex selection circuit 31 to send the SEG signals tested by the first group of probes SA into the analog-to-digital converting circuit 32 for converting the SEG signals into digital signals and sending the signals to the first IC 12 for comparison with the data of the EPROM 11. If the data are the same, the first IC 12 controls the analog multiplex selection circuit 31 to send the SEG signals tested by the second group of probes SB into the analog-to-digital converting circuit 32 to be converted into digital signals which is then sent into the first IC 12 for comparison with the data of the EPROM 11. If the data are different, that is, the test result is incorrect, the data are first recorded in the first IC 12. Then, the first IC 12 controls the analog multiplex selection circuit 31 to send the SEG signals tested by the third group of probes SC into the analog-to-digital converting circuit 32 to be converted into digital signals which is sent to the first IC 12 for comparison with the data of the EPROM 11. After the comparison of the three groups of probes SA, SB, SC is completed, wait until the first IC 12 receives a second COM signal which is logic 0 and then the above test is repeated. Extensively, the above test is repeated when the first IC 12 receives a seventh COM signal which is logic 0. Thereafter, three CGROM characters are completely tested. After the total of times of the first IC 12 exceeds seven (the comparison is performed by N=N+1, whether N≧8), the above test for next three characters are repeated. After all the characters are completely tested, if the characters drive and displayed by the CGROM 43 of the PCB 40 are all correct, the first IC 12 drives the second IC 13 which drives the display panel 42 of the PCB 40 to display predetermined characters such as "CGROM OK". Also, the second IC 13 drives the green light 33 to light so as to indicate good quality of the CGROM 43 of the PCB 40. In case the CGROM 43 has an error inside, the IC 12 drives the second IC 13 which drives the display panel 42 of the PCB 40 to display incorrect characters such as "A". The second IC 13 drives the red light 34 to light and drives the buzzer 35 to buzz three sounds so as to indicate the defective quality of the CGROM 43.

In this embodiment, three characters "A", "B" and "C" are tested. Each character is divided into 5×7 square blocks when displayed (referring to FIG. 6). Each row of the first character "A" is represented by 8-bit binary system: row c1:00000100, row c2: 00001010, row c3: 00010001, row c4: 00010001, row c5: 00011111, row c6: 00010001, row c7: 00010001. Each row of the second character "B" is represented by 8-bit binary system: row c1: 00011110, row c2: 00010001, row c3: 00010001, row c4: 00011110, row c5: 00010001, row c6: 00010001, row c7: 000111110. Each row of the third character "C" is represented by 8-bit binary system: row c1: 00001110, row c2: 00010001, row c3: 00010000, row c4: 00010000, row c5: 00010000, row c6: 00010001, row c7: 00001110. The total 21 8-bit binary groups of character pattern data of the above three characters are previously recorded in the EPROM 11.

Figure 7:
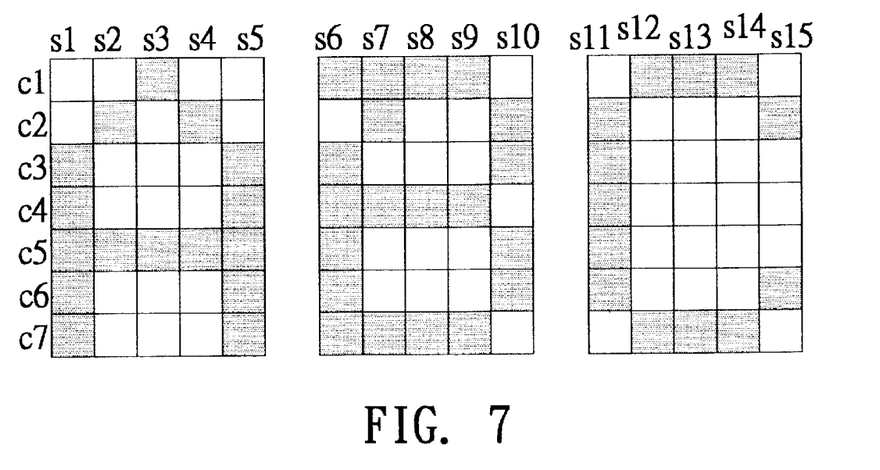
FIG. 7 shows characters A, B, C to be tested, in which character B is incorrect.

In FIG. 7, the display panel 42 displays "A", "B", "C" wherein the "B" is incorrect. The signals obtained by the seven COM signal probes c1~c7 are converted by the analog-to-digital converting circuit 32 into digital signals and then input to the first IC 12. When the first IC 12 judges that the first COM signal is logic 0, the row c1 is to be tested. By means of the sequential selection of the analog multiplex selection circuit 31 and the conversion of the analog-to-digital converting circuit, the converted digital signals of the three groups of probes SA, SB, SC are respectively 00100, 11110, 01110. The three groups of signals are input to the first IC 12 and then represented in 8-bit manner as 00000100, 0001110, 00001110. The three groups of data are compared with the data of row c1 of the three characters previously recorded in the EPROM 11 by the first IC 12. It will be found that the result is the same.

Figure 8:
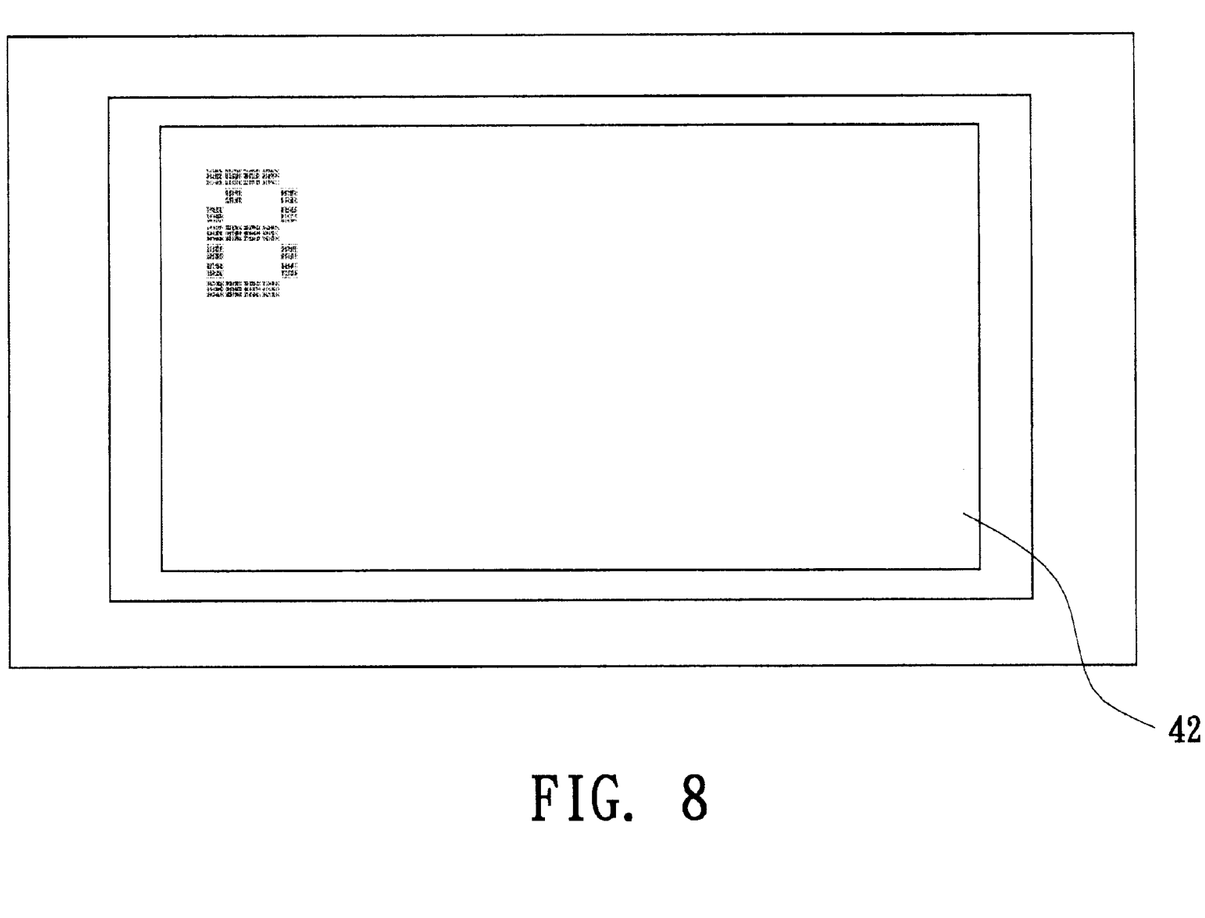
FIG. 8 shows that the display panel of the present invention displays the incorrect character after tested.

When the first IC 12 judges that the second COM signal is logic b 0,the row c2 is to be tested. By means of the sequential selection of the analog multiplex selection circuit 31 and the conversion of the analog-to-digital converting circuit, the converted digital signals of the three groups of probes SA, SB, SC are respectively 01010, 01001, 10001. The three groups of signals are input to the first IC 12 and then represented in 8-bit manner as 00001010, 00001001, 00010001. The three groups of data are compared with the data of row c2 of the three characters previously recorded in the EPROM 11 by the first IC 12. It will be found that the signal received by the second group of SEG probes SB are 00001001 which are different from the data 00010001 of row c2 of the character "B" in the EPROM 11. The first IC 12 will record the character code of "B". After all the data are completely compared, the first IC 12 will output the problematic character code to the second IC 13 which drives the display panel 42 to display the problematic "B" (as shown in FIG. 8). The red light 34 will light and the buzzer 35 will buzz three sounds so as to indicate the defective quality of the CGROM 43.

According to the above arrangement, through the sequential selection of the analog multiplex selection circuit 31 and the conversion of the analog-to-digital converting circuit 32, the character pattern data of predetermined characters inbuilt in the EPROM 11 are compared with the character code driven by the CGROM 43 by the first IC 12 so as to judge whether the drive of the CGROM 43 is problematic. A tester can easily judge whether the CGROM 43 of the PCB 40 is problematic from the green light 33, red light 34, buzzer 35 and the display panel 42. Accordingly, it only takes several seconds to complete the test of one PCB 40. The labor is saved and the test can be quickly completed. Moreover, the man-made error can be minimized.

The above embodiments are only used to illustrate the present invention, not intended to limit the scope thereof. Many modifications of the above embodiments can be made without departing from the spirit of the present invention.

What is claimed is:

1. A CGROM testing device comprising:
   a main body in which an EPROM is disposed, the EPROM having inbuilt character pattern data of a number of predetermined characters, whereby the data of the EPROM can be output to a first IC having functions of data comparison and data memorization, the first IC connecting with and driving a second IC having functions of signal output and control;

a probe module connected with the second IC and controlled thereby, the probe module having a locating board for connecting with a PCB, multiple SEG signal probes and multiple COM signal probes extending from one side of the locating board, the multiple SEG signal probes and COM signal probes being able to respectively contact with multiple detection points of the PCB, the PCB further having a controlling IC in which a CGROM for controlling display of the characters is provided; and a circuit module having an analog multiplex selection circuit and an analog-to-digital converting circuit, the analog multiplex selection circuit being connected with the multiple SEG signal probes of the probe module and the first IC and second IC of the main body, the analog multiplex selection circuit being also connected with the analog-to-digital converting circuit, the analog-to-digital converting circuit being connected with the multiple COM signal probes and the first IC.

2. The CGROM testing device as claimed in claim 1, wherein the circuit module is further provided with a green light, a red light and a buzzer respectively driven by the second IC.

3. The CGROM testing device as claimed in claim 1, wherein there are fifteen SEG signal probes which are evenly divided into a first group of probes, a second group of probes and a third group of probes and there are seven COM signal probes.

4. The CGROM testing device as claimed in claim 1, wherein the PCB is connected with a display panel which is driven by the CGROM of the controlling IC.

* * * * *